United States Patent [19]
Koh et al.

[11] Patent Number: 5,807,782
[45] Date of Patent: Sep. 15, 1998

[54] METHOD OF MANUFACTURING A STACKED CAPACITOR HAVING A FIN-SHAPED STORAGE ELECTRODE ON A DYNAMIC RANDOM ACCESS MEMORY CELL

[75] Inventors: Chao-Ming Koh; Wen-Jya Liang, both of Hsinchu; Bin Liu, Taipei, all of Taiwan

[73] Assignee: Vanguard International Semiconductor Corporation, Hsinchu, Taiwan

[21] Appl. No.: 533,566

[22] Filed: Sep. 25, 1995

[51] Int. Cl.$^6$ ......................... H01L 21/20; H01L 21/8242
[52] U.S. Cl. ............................ 438/396; 438/253
[58] Field of Search ................. 437/47, 48, 52, 437/60, 919, 195; 148/DIG. 14; 438/397, 396, 254, 253; 257/308

[56] References Cited

U.S. PATENT DOCUMENTS

| | | | |
|---|---|---|---|
| 4,742,018 | 5/1988 | Kimura et al. | 437/48 |
| 5,021,357 | 6/1991 | Taguchi et al. | 437/52 |
| 5,053,351 | 10/1991 | Fazan et al. | 437/52 |
| 5,128,273 | 7/1992 | Ema | 437/47 |
| 5,196,365 | 3/1993 | Gotou | 438/397 |
| 5,288,655 | 2/1994 | Higasitani et al. | 437/52 |
| 5,422,295 | 6/1995 | Choi et al. | 437/52 |
| 5,460,999 | 10/1995 | Hong et al. | 437/52 |
| 5,572,053 | 11/1996 | Ema | 257/308 |
| 5,622,882 | 4/1997 | Yee | 438/397 |

*Primary Examiner*—Charles L. Bowers, Jr.
*Assistant Examiner*—Toniae M. Thomas
*Attorney, Agent, or Firm*—George O. Saile; Stephen B. Ackerman

[57] ABSTRACT

A method for manufacturing a stacked capacitor having fin-shaped electrodes with increased capacitance on a dynamic random access memory (DRAM) cell, was achieved. The invention eliminates the need for a silicon nitride etch stop layer, which is known to cause stress in the substrate and lead to defects. The capacitor bottom electrodes having fin shaped portions is fabricated by depositing a multilayer of alternate layers of silicon oxide and doped polysilicon on a partially completed DRAM device having FETs. After forming, with single masking step, the node contacts to the substrate in the multilayer and depositing another doped polysilicon layer, the polysilicon layers and oxide layer are patterned to form the electrodes. An important feature of this invention is that the patterned multilayer is etched to the silicon oxide layer over the bottom polysilicon layer and then the silicon oxide layer(s) are isotropically etched (e.g. in HF) to form the fin capacitor. The fin structure is then used as a mask to anisotropically etch the bottom polysilicon layer, and thereby complete and electrically isolate the bottom fin-shaped electrodes. The capacitor is completed by forming the inter-electrode dielectric and depositing a top electrode layer.

20 Claims, 6 Drawing Sheets

METHOD OF MANUFACTURING A STACKED CAPACITOR HAVING A FIN-SHAPED STORAGE ELECTRODE ON A DYNAMIC RANDOM ACCESS MEMORY CELL

BACKGROUND OF THE INVENTION (1) Field of the Invention

This invention relates to a random access memory device (DRAM) and, more particularly, relates to a method for fabricating DRAM cells having stacked capacitors with increased capacitance. (2) Description of the Prior Art In recent years there has been a dramatic increase in the integrated circuit density on the semiconductor substrate and the semiconductor chips formed therefrom. This increase in density has resulted from down sizing of the individual devices and the resulting increase in device packing density. The reduction in device size was achieved predominantly by recent advances in high resolution photolithography, directional (anisotropic) plasma etching and other semiconductor technology innovations. However, future requirements for even greater circuit density is putting additional demand on the semiconductor processing technologies and on device electrical requirements.

One integrated circuit type experiencing this demand for increased density is the dynamic random access memory (DRAM) circuit, used extensively in the electronics industry for information storage. The circuit on the DRAM chip consists of an array of individual DRAM storage cells that store data or information as electrical charge on a capacitor and are access by peripheral read/write circuits. The individual DRAM storage cells consist of a single field-effect-transistor (FET) (pass transistor) and a single capacitor for storing the charge, and the stored charge is used to represent a bit of data or information. By the year 1998 the bits on a DRAM chip are expected to be about 256 million and by the year 2001 the bit count on the DRAM chip is expect to reach 1 Gigabits.

With this rapid increase in the number of cells on the DRAM chip and the corresponding decrease in physical size of the capacitor, it is becoming increasingly more difficult to store sufficient charge on the storage capacitor to maintain an acceptable signal-to-noise level. If the value of the capacitance is not maintained, then these volatile storage cells also require more frequent refresh cycles to restore the charge on the capacitor.

Since the storage capacitor must occupy an area limited by the cell size, so as to accommodate the array of capacitors on the chip, it is necessary to explore alternative methods for increasing the capacitance without increasing the lateral area that the capacitor occupies on the substrate surface.

One method proposed, is to form trench capacitor by etching trenches in the semiconductor substrate and forming capacitors therein. Unfortunately, as the cell density increases it is difficult to built the FET and the capacitor in the same cell area, and at the same time maintain sufficient separation between capacitor trenches. As an alternative approach, stacked capacitors formed on the surface and over the FET, are also being pursued for DRAM applications. The stacked capacitor has received considerable interest in recent years because of the variety of ways that its shape can be controlled to increase the capacitance surface area without increasing the area it occupies on the substrate. This versatility makes the stacked capacitor very desirable for DRAM applications.

Many of these three-dimensional stacked capacitor structures have been reported in the recent literature. For example, one capacitor structure receiving special interest is a capacitor having a fin shaped electrode. The bottom or capacitor node electrode makes electrical contact to one of the source/drain contacts (node contact) of the FET and extends up-ward and out-ward over the cell area. The potential for stacking increased number of fin structures on the electrode, to increase the capacitance is attracting much interest. For example, a number of patents that teach methods of making fin-shaped structures include S. Kimura, U.S. Pat. No. 4,742,018, P. Fazan, U.S. Pat. No. 5,053,351, and M. Higasitani, U.S. Pat. No. 5,288,655. Still another patent for a fin-shaped capacitor is by M. Taguchi, U.S. Pat. No. 5,021,357.

In a number of these patents the fin-shaped electrode(s) are typically formed from alternating layer of polysilicon and an insulating layer, such as silicon oxide. The multilayer is then patterned to form the array of capacitor structures. The polysilicon layers are connected by a common polysilicon layer and the silicon oxide is then removed by an isotropic etch, such as in hydrofluoric acid (HF), to leave a free standing fin-shaped electrode. A second insulating layer having a substantially low etch rate than the silicon oxide, such as silicon nitride ($Si_3N_4$), is usually used over the devices on the substrate to prevent the isotropic etch from eroding the underlying device structures. However, because of the high stress associated with silicon nitride, stress induced defects can occur in the single crystal silicon substrate. It is generally not a good practice in the semiconductor industry to use a silicon nitride layer at or near the substrate surface. Therefore, an addition silicon oxide layer is usually required under the silicon nitride layer, increasing the number of process steps. Also, in some prior art processes still additional steps are required to form the node contact by repeatedly masking and etching the insulator between the polysilicon layers. These additional process step lead to increased cost, lower process yield and final product yields.

Therefore, there is still a strong need in the semiconductor industry for making a reliable low cost DRAM product having fewer and improved processing steps.

SUMMARY OF THE INVENTION

The above disadvantages in the prior art are over come by the method of this present invention. The improvements are achieved according to the following objectives.

It is a principal object of this invention to provide a dynamic random access memory (DRAM) device having stacked capacitor with fin-shaped electrodes and increased capacitance.

It is another object of the present invention to fabricate these stacked capacitors using a polysilicon layer as the isotropic etch stop that also is used to form part of the capacitor, and thereby eliminate the need for an additional silicon nitride etch stop layer.

It is still another object of the invention to fabricate this DRAM device using this polysilicon etch stop layer in conjunction with a single masking and etching step for making the node contact to the source/drain contact of a FET device, and thereby minimize the number of masking levels.

It is a further object of the invention to provide this improved high capacitance stacked capacitor on a DRAM cell while achieving a simple manufacturing process with good reliability at low cost.

This invention addresses these objects by teaching a method for forming an array of high capacitance stacked capacitors on an array of memory cells that form part of a DRAM device. The method begins by forming a field oxide (FOX) on the surface of a semiconductor substrate doped to have a chosen conductivity type, while leaving device areas on the substrate for fabricating field effect transistors (FET), A gate oxide is grown on the device areas. A first polysilicon layer and then a first insulating layer is deposited and both layers are patterned to form the gate electrodes for the FETs. Source/drain areas are formed in the substrate adjacent to the gate electrodes by selectively implanting a dopant of opposite conductivity type than the substrate. Sidewall spacers are formed on the gate electrode sidewalls by depositing and etching back a sidewall spacer insulating layer.

The stacked capacitors of this invention are now formed by the following sequence of process steps. A second insulating layer is deposited over the FETs and elsewhere on the substrate. An in situ doped second polysilicon layer is deposited on the second insulating layer, and then a third insulating layer is deposited on the doped second polysilicon layer. The doped second polysilicon layer is of a dopant conductivity type the same as the source/drain. Using a patterned photoresist mask and an anisotropic plasma etch, contact openings are formed in the multilayer composed of the third insulating layer, the second polysilicon layer and the second insulating. The contact openings are etched to one of the two source/drain areas of each field effect transistor in the memory cell of the DRAM device to form the node contacts. The photoresist mask is removed and an in situ doped third polysilicon layer having the same conductivity type as the source/drain is deposited on the third insulating and in the contact openings and thereby making contact to the source/drain area of each transistor and forming the node contacts for the planned bottom capacitor electrode. The third polysilicon layer also electrically contacts the second polysilicon layer in the sidewall of the contact openings. A patterned photoresist layer is used to mask portions of the third polysilicon layer aligned over the contact openings and extending outward over the intended area of the bottom electrode for each stacked capacitor of the memory cells. The exposed third polysilicon layer between and around the patterned photoresist masked areas is then anisotropically etched to the surface of the third insulating layer, and thereby defining a top fin portion for the bottom electrode.

Now, an important key feature of this present invention, the third insulating layer, which serves as a sacrificial layer, is completely removed by isotropic etching which includes etching the portion of the third insulating layer under the outward extending portions of the patterned third polysilicon layer. The patterned photoresist mask and the patterned third polysilicon layer are used as an etch mask to anisotropically etch the second polysilicon layer to the surface of the second insulating layer. The photoresist mask layer is then removed by conventional means to leave remaining a free standing bottom electrodes, each electrode having two fin-shaped portions formed from the second and third doped polysilicon layers. A thin capacitor dielectric film is formed on the surface of the bottom electrode and a conformal fourth polysilicon layer is deposited to form the top capacitor electrodes and thereby complete the array of DRAM cells, each cell having a high capacitance stacked capacitors.

BRIEF DESCRIPTION OF THE DRAWINGS

The objects and advantages of this invention are best understood by the following embodiments with reference to the attached drawings which include.

DESCRIPTION OF THE PREFERRED EMBODIMENTS

Figure 1:
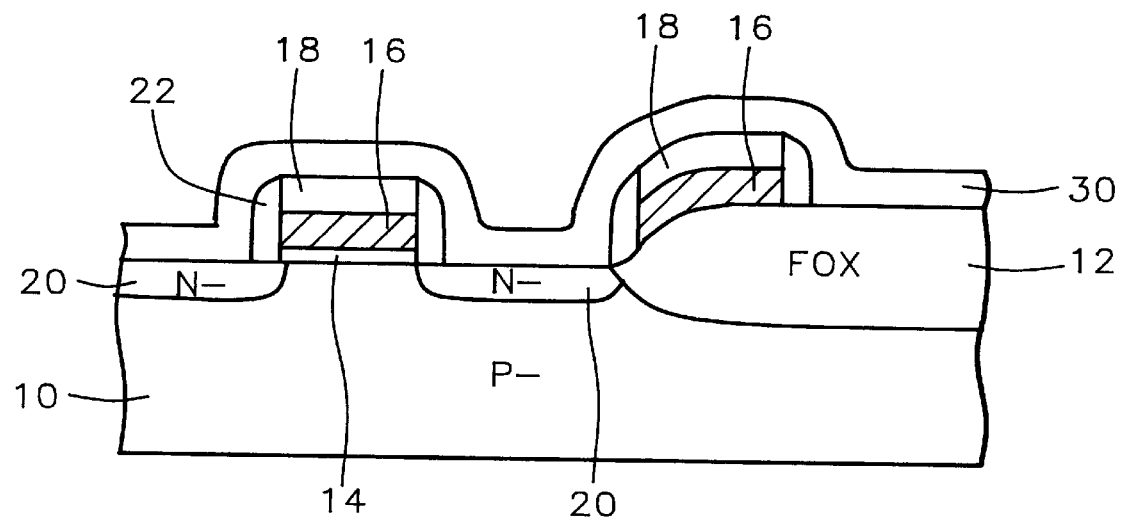
FIGS. 1 through 11 that depict in schematic cross-sectional representations the method of fabricating a high capacitance fin-shaped stacked capacitor of this invention which are used with a FET to make a DRAM storage cell.

Now in keeping with the objects of this invention, the method for forming the stacked capacitor with increased capacitance is covered in detail. The sequence of fabrication steps for this embodiment are shown in FIGS. 1 throught 10. The storage capacitor is usually fabricated on an N-channel field effect transistor (FET) structures which are currently used in the manufacture of DRAMs. Therefore, only a brief description of the FET structure is given, sufficient for understanding the current invention.

It should also be well understood by one skilled in the art that by including additional process steps, in addition to those described in this embodiment, other types of devices can also be included on the DRAM chip, For example, P channel FETs can be formed by providing N-Wells in the P substrate and Complementary Metal-Oxide-Semiconductor (CMOS) circuits can also be formed therefrom.

Referring now to FIG. 1, a cross-sectional view of a portion of substrate 10 having a partially completed DRAM cell with a FET formed on and in the substrate surface, is schematically shown. The preferred substrate is composed of a P-type single crystalline silicon having a <100> crystallographic orientation. A relatively thick Field OXide (FOX) 12 is formed around the active device regions which isolate the individual device regions. The field oxide, only partially shown in FIG. 1, is usually formed by the LOCal Oxidation of Silicon (LOCOS) method. The LOCOS method involves growing a thin silicon oxide (pad oxide) by thermal oxidation, and then depositing a thicker silicon nitride layer as an oxidation barrier layer. Conventional photo-lithographic techniques and etching are then used to remove the barrier layer in areas where a field oxide is desired while retaining the silicon nitride in areas where active devices are to be fabricated. The silicon substrate is then oxidized to form the field oxide. The preferred thickness is between about 3500 to 5500 Angstroms.

The semiconductor device is then formed in the active device regions after removing the silicon nitride barrier layer and pad oxide in a wet etch. The most commonly used device for dynamic random access memory is the N-channel field-effect transistor (N-FET). This device is formed by first thermally oxidizing the active device region to form a thin gate oxide 14. The preferred thickness of the gate oxide 14 is typically between about 70 to 200 Angstroms. An appropriately doped, usually N-type, first polysilicon layer 16 and a first insulating layer 18 are deposited and conventional photolithographic techniques and anisotropic plasma etching are used to pattern the two layers 16 and 18. This forms the gate electrode 16 for the N-FET in the active device regions and also forms conducting patterns (word lines) elsewhere on the substrate with the insulating layer 18 thereon. These conducting patterns form the word lines that electrically connect the gate electrode of the FET to the appropriate peripheral circuits on the DRAM chip. Lightly doped self-aligned source/drain areas 20 are formed next adjacent to the gate electrode 16, usually by using the gate electrode as part of the implant mask and implanting an N-type dopant species such as arsenic or phosphorus. For example, a typical implant might consist of phosphorus $p^{31}$ at a dose of between 1 E 13 to 10 E 13 atoms/cm$^2$ and an energy of between about 30 to 80 Kev.

After forming the lightly doped source/drain, sidewall spacers 22 are formed on the sidewalls of the gate electrode 16. These sidewall spacers 22 are typically formed by depositing a low temperature silicon oxide and anisotropically etching back to the silicon surface. For example, the silicon oxide can be a chemical vapor deposition using tetraethoxysilane (TEOS) at a temperature in the range of about 650° to 900° C. and the etch back performed in a low pressure reactive ion etcher. An $N^+$ source/drain implantation is used to complete the source/drain areas. Alternatively, the source/drain contacts can be completed at a later process step whereby the dopant is out diffused from an N type doped polysilicon layer. The $N^+$ doped contact are not depicted in FIG. 1.

The remainder of this embodiment relates more specifically to the method of fabricating the fin-shaped stacked capacitor, according to the objects of this invention. The invention utilizes the big difference in etch rates between an insulating layer, such as silicon oxide, and a polysilicon layer to eliminate the need for a silicon nitride ($Si_3N_4$) etch stop layer, which is known to create a high stress on substrates. The invention utilizes one of the polysilicon layer used as part of the capacitor structure to provide an etch stop layer, and therefore also simplifies the process.

Referring still to FIG. 1, a second insulating layer 30 is deposited over the N-FET formed in the active device area and also over the word lines elsewhere on the substrate. The second insulating layer 30 is preferably a silicon oxide deposited by chemical vapor deposition (CVD). For example, the deposition can be performed in a low pressure chemical vapor deposition (LPCVD) reactor using, for example, the decomposition of tetraethosiloxane (TEOS). The preferred thickness of layer 30 is between about 800 to 2500 Angstroms.

Figure 2:
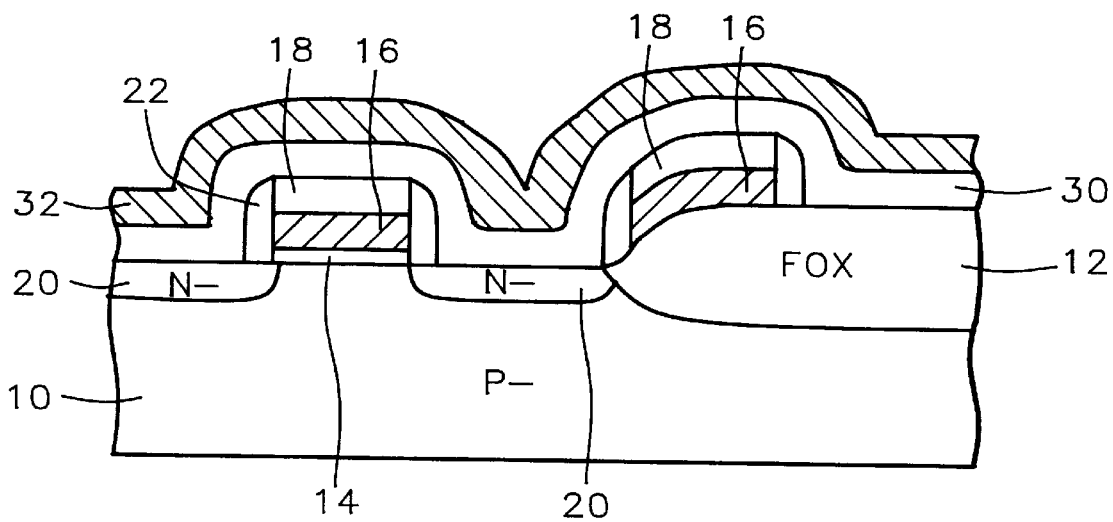

Referring now to FIG. 2, a second polysilicon layer 32 is deposited over the second insulating layer 30. For example, the polysilicon layer 32 can be deposited by LPCVD deposition using a reactant gas containing silane ($SiH_4$). The layer 32 is preferably in situ doped N type during the polysilicon deposition, such as with phosphorous (P) atoms by adding a dopant gas such as phosphine to the CVD reactant gases. The preferred dopant concentration is between about 1.0 E 19 to 1.0 E 21 atoms/cm$^3$, and the preferred thickness of layer 32 is between about 1000 to 3000 Angstroms.

The polysilicon layer 32 provides an important function in the invention because it is later used as an etch stop layer that replaces the need for a silicon nitride layer and is then used as the low fin-structure for the stacked capacitor.

Figure 3:
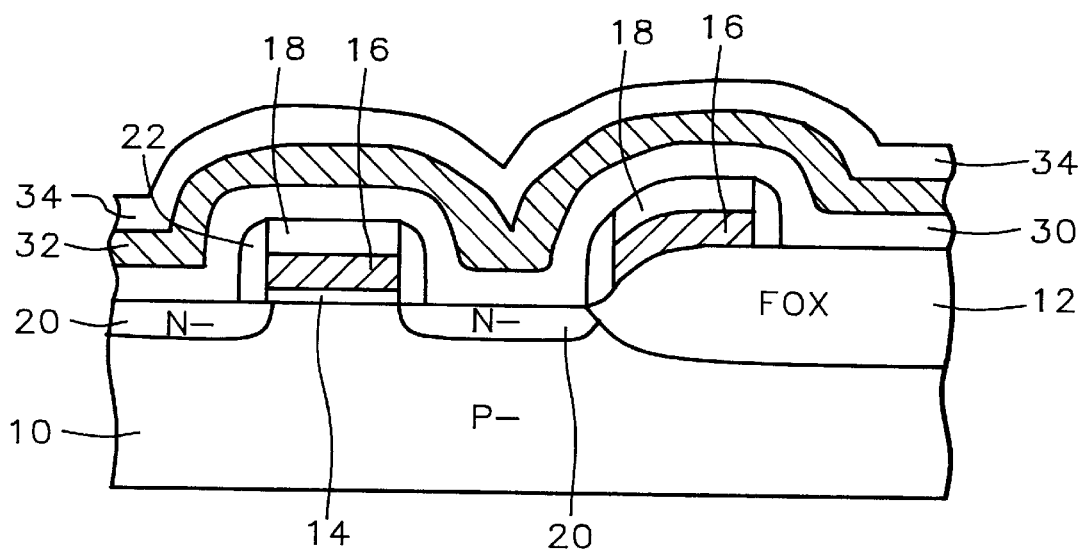

Referring next to FIG. 3, a third insulating layer 34 is deposited on layer 32 and is preferably composed of a CVD silicon oxide. For example, the deposition of layer 34 can be carried out by anyone of a number of CVD methods, such as in a atmospheric pressure chemical vapor deposition (APCVD) reactor, plasma enhanced chemical vapor deposition (PECVD) reactor or a LPCVD reactor. The preferred thickness of layer 34 is between about 500 to 2000 Angstroms.

Figure 4:
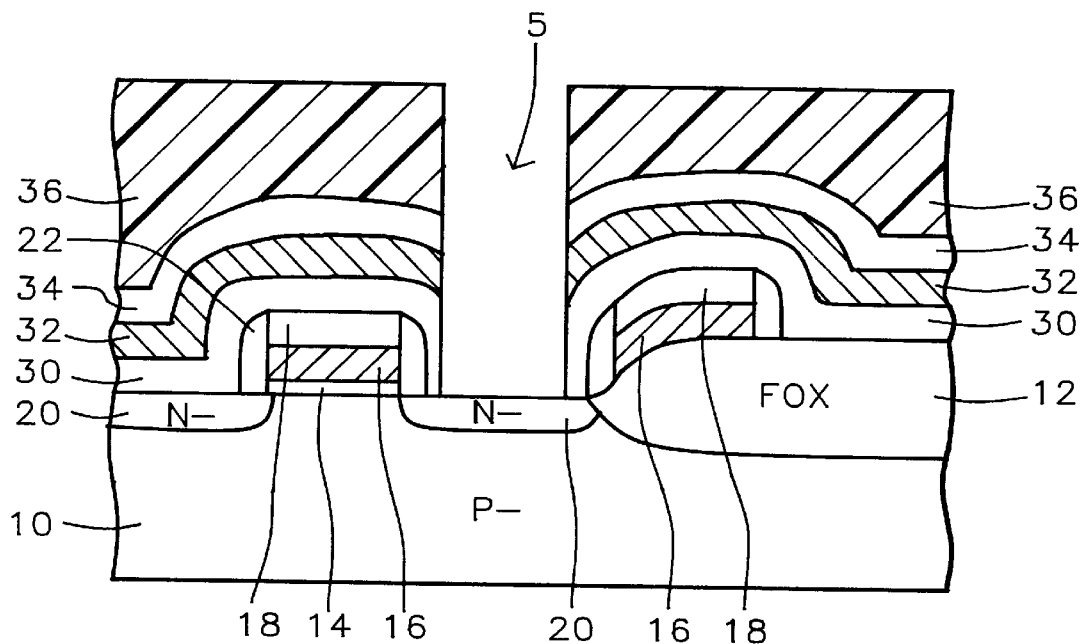

Conventional photolithographic techniques and anisotropic plasma etching is used to form the contact opening for the node contact, as shown in FIG. 4. Shown in the Figure is the contact opening etched in the multilayer composed of layers 34, 32 and 30 with the patterned photoresist layer 36 still in place. The contact opening 5 is made to one of the two source/drain areas selected as the node contact for the capacitor electrode, as shown in FIG. 4. The etching is typically carrier out in a reactive ion etcher (RIE) or a high density plasma etcher using an appropriate etching gas mixture for each layer. For example, the etching for the silicon oxide layers can be preformed in a gas containing fluorine atomic species, such as carbon tetrafluoride ($CF_4$) while the etching for the polysilicon layer can be preformed in a gas containing a chlorine species. After etching the contact opening 5 the photoresist layer 36 is removed by conventional means, such as plasma ashing in oxygen, and/or wet chemical stripping.

Although the contact openings in this embodiment are not self-aligned to the gate electrode 16, it should be well understood by those skilled in the art that self-aligned contacts can be formed, aligned to the edge of the sidewall spacer 22 using commonly practiced methods.

Figure 5:
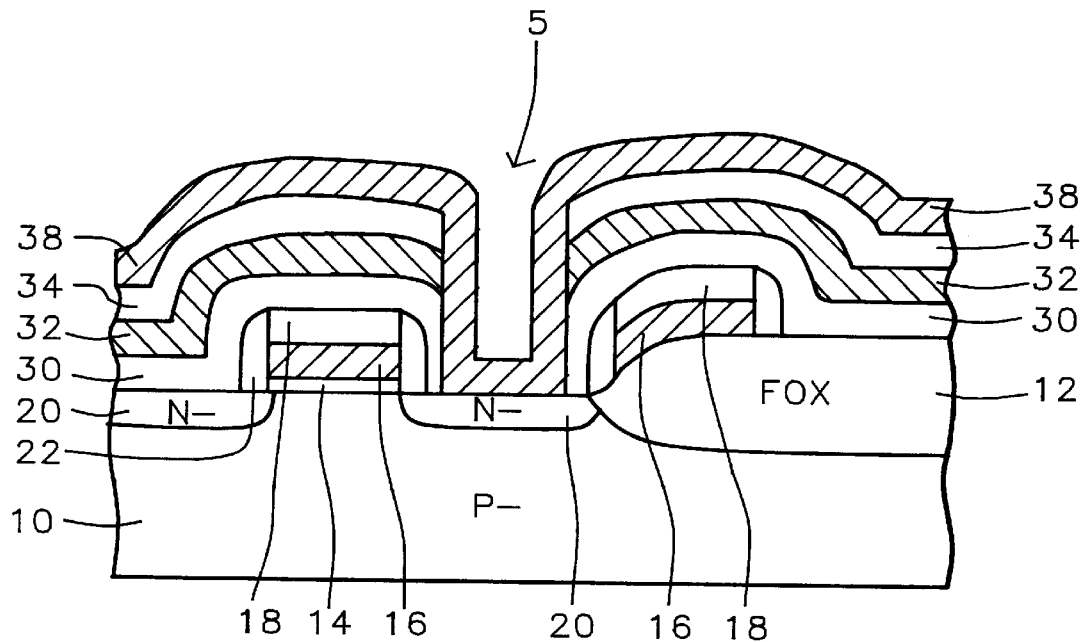

Referring next to FIG. 5, a conformal third polysilicon layer 38 is deposited on the third insulating layer 34 and in the contact opening 5. The polysilicon layer 38 is preferably deposited by LPCVD deposition using, for example, a reactant gas containing silane ($SiH_4$). The layer 38 is preferably in situ doped N type during the polysilicon deposition, such as with phosphorous (P) atoms by adding a dopant gas such as phosphine to the CVD reactant gases. The preferred dopant concentration is between about 1.0 E 19 to 1.0 E 21 atoms/cm$^3$, and the preferred thickness of layer 38 is between about 500 to 2000 Angstroms.

Layer 38 forms the stacked capacitor node contact to the source/drain area of the FET and also makes electrical contact to the second polysilicon layer 32 in the opening 5, as shown in FIG. 5.

Figure 6:
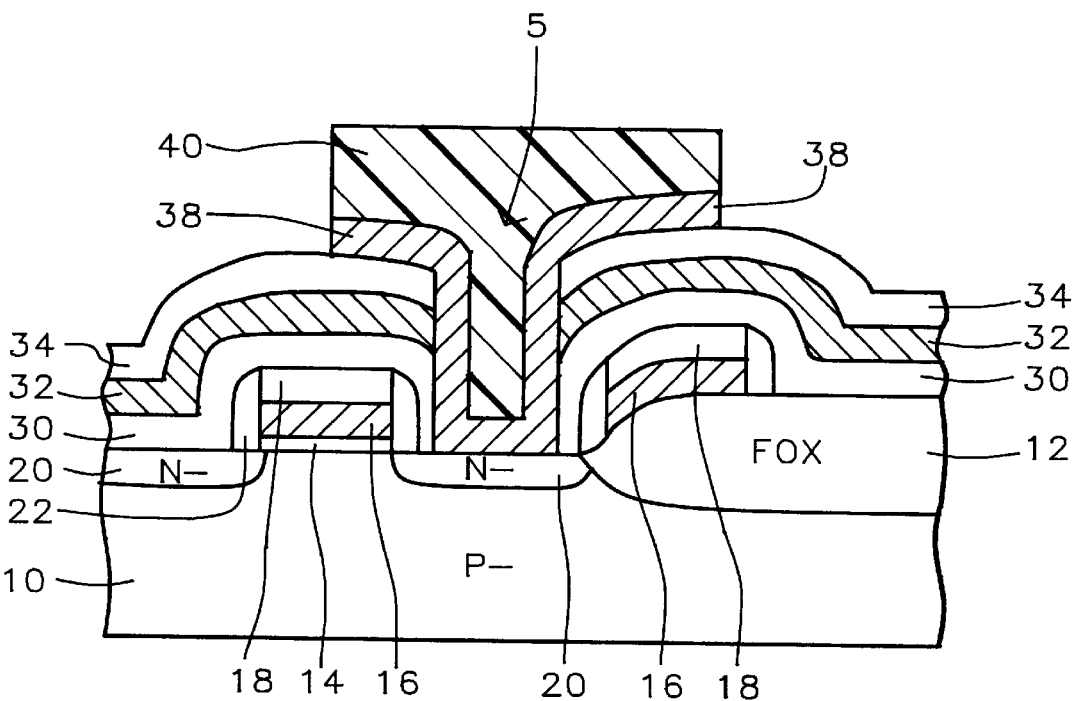

Referring to FIG. 6, a second photoresist layer 40 is coated on the polysilicon layer 38, and patterned by conventional photolithographic means to form portions aligned to and over the node contact opening 5. The patterned photoresist layer 40 also extends outward to define the horizontal area of the capacitor bottom electrode over the memory cell area. The exposed portions of the third polysilicon layer 38 between and around each cell area is then anisotropically etched to the surface of the third insulating layer 34. The patterned layer 38 defines the upper portion of the stacked capacitors bottom electrode. Over etching into layer 34 is not critical since it is a sacrificial oxide that will soon be removed.

Figure 7:
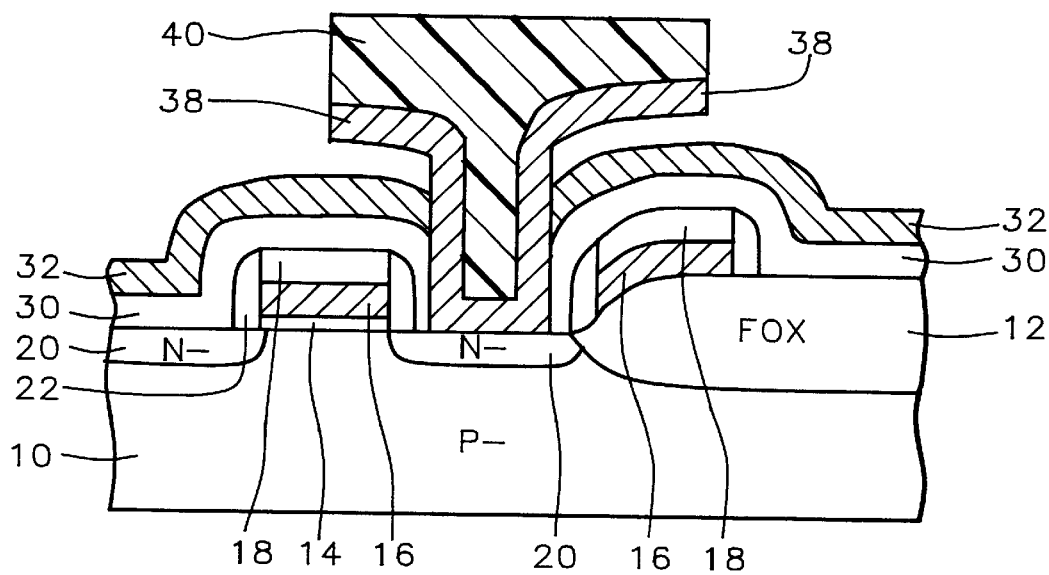

The third insulating layer 34 exposed in the areas between the patterned third polysilicon layer 38, as shown in FIG. 6, is now removed by an isotropic wet etch. For example, the silicon oxide layer 34 can be removed by immersing the substrate in a hydrofluoric (HF) acid solution or by exposing the substrate to an isotropic vapor etch. As is also shown in FIG. 7, the oxide layer 34 is also removed from the region between the patterned portion of the top polysilicon layer 38 and the blanket polysilicon layer 32, and thereby forming a free standing portion of the bottom electrode. An important feature of the invention is the functioning of the polysilicon layer 32 as an etch stop layer during the isotropic etching of oxide layer 34 in the HF acid solution. This allows one to avoid the use of a silicon nitride layer and thereby avoid the stress associated with the silicon nitride layer as described in the prior art.

Figure 8:
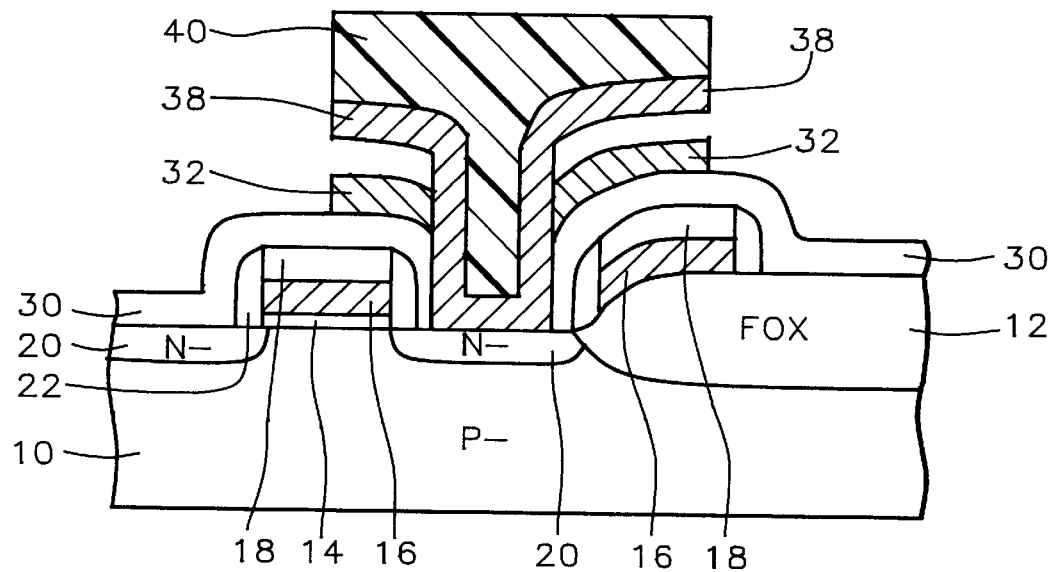

With the photoresist mask 40 still in place on the patterned portions of layer 38 (FIG. 7) the substrate is subjected to an anisotropic plasma etching. The mask 40 and the layer 38 provides a mask for etching the second poly-silicon layer 32. The directional etch results in portions of layer 32 remaining under and aligned to portions of layer 38, and thereby forming a lower fin structure on the bottom capacitor electrode, as shown in FIG. 8.

Figure 9:
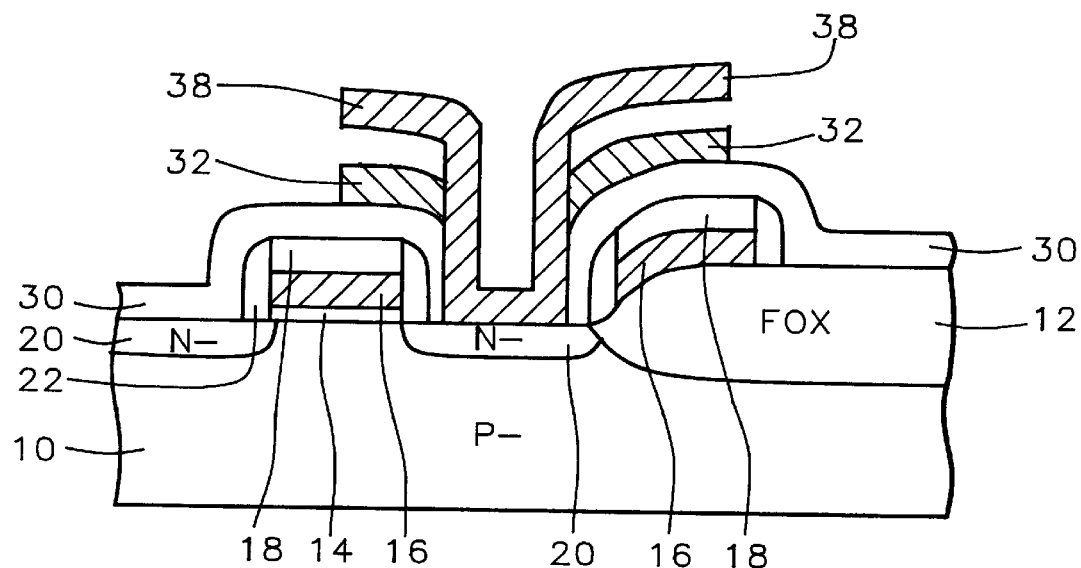

After removing the photoresist mask 40, by conventional means, a free standing capacitor bottom electrode results, as shown in FIG. 9.

Figure 10:
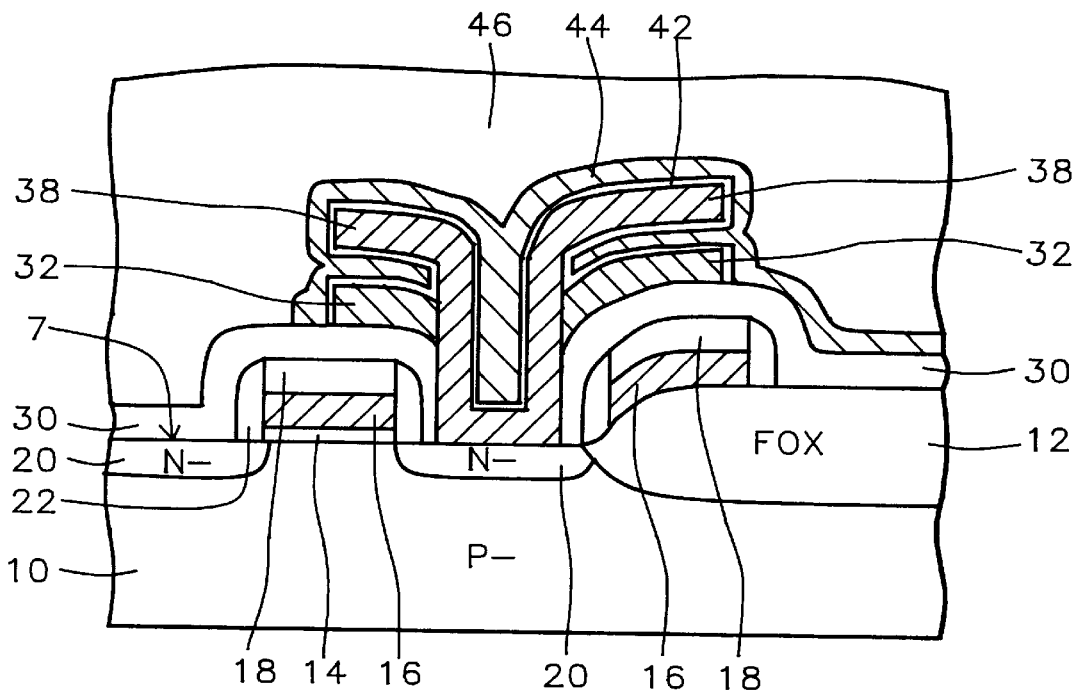

The stacked storage capacitor for the DRAM cell is now completed, as shown in FIG. 10. The process involves forming a capacitor inter-electrode dielectric layer 42 on the surface of the capacitor bottom electrode composed of layer 32 and 38. Preferably, the dielectric layer 42 is composed of layers of silicon nitride and silicon oxide ($Si3N_4/SiO_2$) or layers of silicon oxide, silicon nitride and silicon oxide (ONO). For example, the dielectric layer 42 composed of silicon nitride and silicon oxide can be formed by depositing a silicon nitride layer using low pressure chemical vapor deposition (LPCVD) and a reactive gas mixture of ammonia ($NH_3$) and dichlorosilane ($SiH_2Cl_2$) followed by oxidation of the silicon nitride layer in a wet oxygen at a temperature of about 850° C. for about 10 to 30 minutes. The preferred total thickness of the inter-electrode dielectric is between about 45 to 60 Angstroms.

Also shown in FIG. 10, a fourth polysilicon layer 44 is deposited on the inter-electrode dielectric layer 42. The layer 44 conformally covers the bottom electrode and forms the top electrode for storage capacitor. The layer 42 also fills the recess between the fin shaped portion of the capacitor bottom electrode, and thereby completes the fin shaped storage capacitors. The fourth polysilicon layer 44 is preferably deposited by LPCVD and is in situ doped N-type. The preferred thickness of polysilicon layer 44 is between about 500 to 1500 Angstroms and is doped with an N-type dopant impurity, such as with phosphorus (P). The preferred concentration of the P being in the range of between about 1.0 E 19 to 1.0 E 21 atoms/$cm^3$.

The top electrode polysilicon layer 44 is then patterned using conventional photolithographic techniques and plasma etching to complete the stacked capacitor, as shown in FIG. 10. The array of memory cells, only one of which is shown in FIG. 10, are electrically insulated by depositing a fifth insulating layer 46. Typically, the layer 46 is composed of a LPCVD TEOS oxide layer that serves as a barrier layer and is deposited having a preferred thickness of between about 500 to 1500 Angstroms. A thicker oxide having a low flow temperature, such as borophosphosilicate glass (BPSG), is then deposited and annealed to provide a more planar surface for the next level of interconnection.

Typically, the BPSG is deposited to a thickness of between about 4000 to 5500 Angstroms.

During the thermal processing on the substrate, out diffusion of the $N^+$ dopant from polysilicon layer 38 forms the ohmic contact 21 ($N^+$) in the node contact lightly doped source/drain area 20 ($N^-$) region, as shown in FIG. 10. Alternatively, if a higher dopant concentration is required an additional ion implantation step can be included at an earlier processing step, for example, after the sidewall spacer formation.

Finally, not shown in FIG. 10, bit lines contacts and bit lines are provided to the second source/drain area of each of the DRAM memory cells, as indicated by the area label 7 in FIG. 10. However, it should be well understood by one skilled in the art that by including additional process steps the bit line contact and the bit line metallurgy can be formed either prior to or after the stacked storage capacitor is fabricated as is commonly reported in the literature and practiced in the industry, and that both methods are applicable to this invention.

Figure 11:
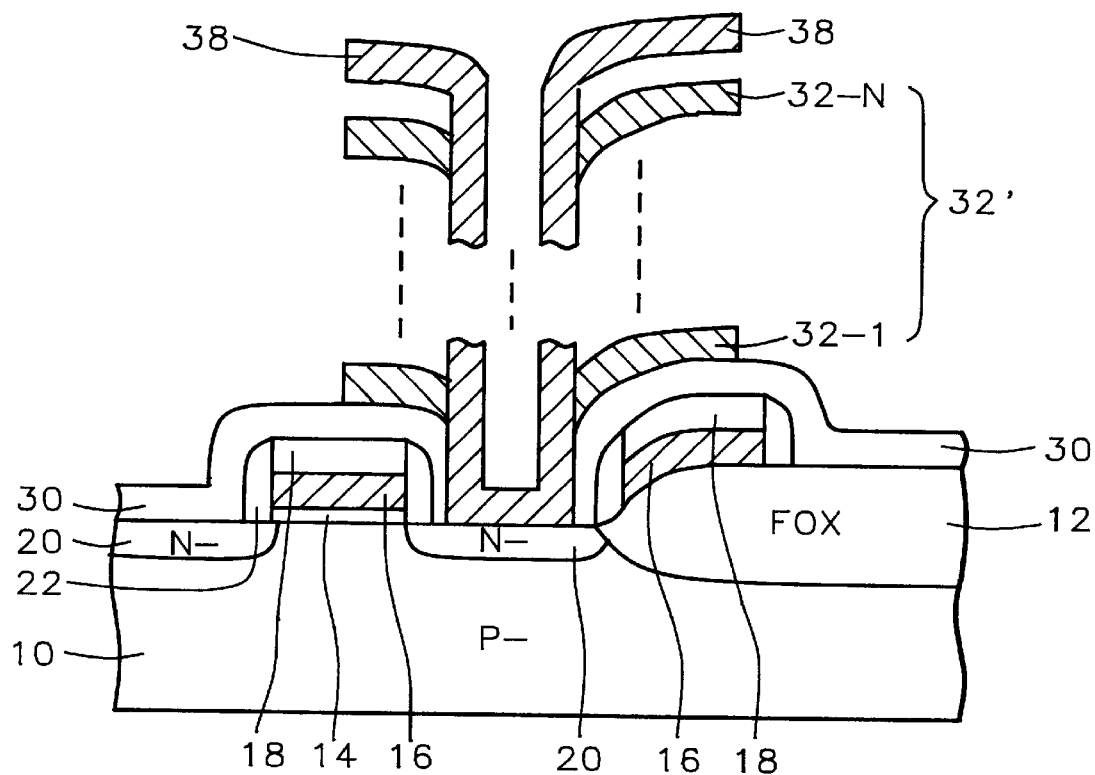

Although the method of this invention is describe for stacked capacitors having two fin-shaped portions, the method is equally applicable to the formation of a stacked capacitor having a multi-fin structure with more than two fins with only minor changes to the two fin process. A completed bottom electrode structure for this multi-fin capacitor structure having N+1 fins is depicted in FIG. 11. The method involves replacing the polysilicon layer 32 in FIG. 3 with a multi-layer structure comprising of alternate polysilicon and insulating layers. For example, the multi-layer structure 32' can be composed of N polysilicon layers 32-1 through 32-N, as depicted in the completed bottom capacitor electrode structure of FIG. 11, but having insulating layers, such as CVD silicon oxide, there between. The process then continues similar to the process shown in FIGS. 4–10 with a few minor exceptions. The contact opening 5 in FIG. 4 is now etched through insulating layer 34, the multi-layer 32', and the insulating layer 30 to form the node contact opening to the FET source/drain contact area 20. The conformal third polysilicon layer 38 deposited on layer 34 and in the contact opening 5, as shown in FIG. 5, now also electrically contacts the polysilicon layers 32-1 through 32-N comprising the multi-layer. During the patterning of the bottom electrode, as shown in FIG. 6, the anisotropic plasma etch is also continued through layer 34 and the multi-layer 32', which now replaces layer 32, stopping at the first polysilicon layer 32-1. The remaining portions of the insulating layer 34, and the insulating layers between the patterned polysilicon layers 32-1 through 32-N are isotropically etched, such as in a hydrofluoric acid solution, using the bottom unetched polysilicon layer 32-1 as an etch stop layer to protect the device areas. With the photoresist mask 40 still in place, as shown in FIG. 8, the first or bottom polysilicon layer 32-1 in the multilayer is patterned by anisotropic plasma etching to form the array of electrically isolated multi-fin bottom electrode, as is depicted in FIG. 11 after removing the photoresist mask. The stacked capacitors are then completed by forming an interelectrode dielectric layer on the bottom electrodes and a top capacitor electrode according to the method for the two fin process. The preferred thickness of the individual polysilicon layers 32-1 through 32-N are between about 1000 to 3000 Angstroms and the preferred thickness of the insulating layers multilayer is between about 500 to 2000 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method for fabricating stacked storage capacitors on a semiconductor substrate having device areas with field effect transistors formed therein, comprising the steps of:

said field effect transistors having gate electrodes patterned from a first polysilicon layer having on the surface a first insulating layer, said field effect transistors having source/drain areas adjacent to said gate electrodes and said gate electrodes having sidewall spacers;

depositing a second insulating layer on said device areas and elsewhere on said substrate;

using a second polysilicon deposition over said second insulating layer to form a multilayer composed of alternating polysilicon layers and insulating layers, wherein the number of said polysilicon layers is at least two and one of said polysilicon layers forms a bottom layer of said multilayer;

depositing a third insulating layer an said multilayer;

forming by masking and anisotropic etching contact openings in said third insulating layer, said multilayer, and said second insulating layer, said contact openings aligned over and etched to one of two said source/drain areas of each of said field effect transistors, and thereby forming node contact openings for said stacked storage capacitors;

depositing a doped third polysilicon layer on said third insulating layer and in said contact openings, and thereby making electrical contact to said source/drain areas and to said polysilicon layers of said multilayer exposed in sidewalls of said contact openings;

coating a photoresist layer on said third poly silicon layer;

patterning said photoresist layer to form patterned photoresist masked areas by leaving portions of said photoresist layer over and aligned to said contact openings, and extending outward over said third polysilicon layer and thereby defining the areas of the bottom electrodes for each of said stacked storage capacitors;

anisotropically etching said third polysilicon layer, said third insulating layer and said multilayer down to the surface of the bottom polysilicon layer of said multilayer on said second insulating layer in exposed areas between and around said photoresist masked areas;

isotropically etching said third insulating layer and said insulating layers of said multilayer;

anisotropically etching said bottom polysilicon layer of said multilayer to said second insulating layer, and thereby leaving portions of said polysilicon layers of said multilayer under and aligned to said photoresist masked areas and said patterned third polysilicon layer;

removing said photoresist layer from said photo resist masked areas, and thereby providing said bottom electrodes of said stacked storage capacitors, each of said bottom electrodes having multiple fin-shaped polysilicon portions, wherein the number of said multiple fin-shaped polysilicon portions is at least three;

forming a capacitor dielectric layer on the surface of said bottom electrodes;

depositing a fourth polysilicon layer, and thereby forming capacitor top electrodes;

patterning said fourth polysilicon layer and thereby completing said stacked storage capacitors on said semiconductor substrate.

2. The method of claim 1, wherein said second insulating layer is silicon oxide having a thickness of between about 800 and 2500 Angstroms.

3. The method of claim 1, wherein each of said polysilicon layers of said multilayer is between about 1000 and 3000 Angstroms thick and is doped $N^+$ with an N-type dopant, and each of said insulating layers of aid multilayer is silicon oxide having a thickness of between about 500 and 2000 Angstroms.

4. The method of claim 1, wherein said third insulating layer is a silicon oxide having a thickness of between about 500 and 2000 Angstroms.

5. The method of claim 1, wherein said third poly silicon layer is between about 500 and 2000 Angstroms thick and is doped $N^+$ with an N-type dopant.

6. The method of claim 5, wherein said dopant in said third polysilicon layer is phosphorus (P) and the dopant concentration in said third polysilicon layer is between about 1.0 E 19 and 1.0 E 21 atoms/cm$^3$.

7. The method of claim 1, wherein said isotropic etching of said third insulating layer and said insulating layers of said multilayer is carried out in a hydrofluoric (HF) acid solution.

8. The method of claim 1, wherein said bottom polysilicon layer of said multilayer provides an etch-stop layer for said isotropic etching.

9. The method of claim 8, wherein said bottom poly silicon layer of said multilayer eliminates the need for an additional silicon nitride etch-stop layer.

10. A method for fabricating a dynamic random access memory (DRAM) device on a semiconductor substrate having an array of memory cells, comprising the steps of:

forming on said semiconductor substrate an array of device areas, surrounded and electrically isolated by field oxide areas;

patterning from a first polysilicon layer having a first insulating layer on the surface, gate electrodes for field effect transistors in said device areas and forming word lines elsewhere on said substrate; and forming source/drain areas in said device areas adjacent to said gate electrodes;

forming sidewall spacers on said gate electrodes; and forming stacked storage capacitors to one of two said source/drain areas of each of said field effect transistors in said array of device areas by, depositing a second insulating layer on said device areas and elsewhere on said substrate, using a second polysilicon deposition over said insulating layer to form a multilayer composed of alternating polysilicon layers and insulating layers, wherein the number of said polysilicon layers is at least two and one of said polysilicon layers forms a bottom layer of said multilayer, depositing a third insulating layer on said multilayer, forming by masking and anisotropic etching contact openings in said third insulating layer, said multilayer, and said second insulating layer, said contact openings aligned over and etched to one of two said source/drain areas of each of said field effect transistors, and thereby forming node contact openings for said stacked storage capacitors, depositing a doped third polysilicon layer on said third insulating layer and in said contact openings, and thereby making electrical contact to said source/drain areas and to said polysilicon layers of said multilayer exposed in sidewalls of said contact openings, coating a photoresist layer on said third polysilicon layer, patterning said photoresist layer to form patterned photoresist masked areas by leaving portions of said photoresist layer over and aligned to said contact openings, and extending outward over said third polysilicon layer and thereby defining the areas of the bottom electrodes for each of said stacked storage capacitors, anisotropically etching said third polysilicon layer, said third insulating layer and said multilayer down to the surface of the bottom polysilicon layer of said multilayer on said second insulating layer in exposed areas between and around said photoresist masked areas, isotropically etching said third insulating layer and said insulating layers of said multilayer, anisotropically etching said bottom polysilicon layer of said multilayer to said second insulating layer, and thereby leaving portions of said polysilicon layers of said multilayer under and aligned to said photoresist masked areas and said patterned third polysilicon layer, removing said photoresist layer from said photo resist masked areas, and thereby providing said bottom electrodes of said stacked storage capacitors, each of said bottom electrodes having multiple fin-shaped polysilicon portions, wherein the number of said multiple fin-shaped portions is at least three, forming a capacitor dielectric layer on the surface of said bottom electrodes, depositing a fourth polysilicon layer, and thereby forming capacitor top electrodes, patterning said fourth polysilicon layer and thereby completing said stacked storage capacitors for said array of memory cells on said semiconductor substrate; and further depositing a fourth insulating layer;

forming bit line contact openings in said fourth insulating layer and said second insulating layer to second of said source/drain contact areas of each of said field effect transistors in said device areas;

patterning a conducting layer and forming an array of bit lines on said fourth insulating layer and in said bit line contact openings, and thereby completing said array of memory cells for said dynamic random access memory (DRAM) device.

11. The method of claim 10, wherein said second insulating layer is silicon oxide having a thickness of between about 800 and 2500 Angstroms.

12. The method of claim 10, wherein each of said polysilicon layers of said multilayer is between about 1000 and 3000 Angstroms thick and is doped $N^+$ with an N-type dopant, and each of said insulating layers of said multilayer is silicon oxide having a thickness of between about 500 and 2000 Angstroms.

13. The method of claim 10, wherein said third insulating layer is a silicon oxide having a thickness of between about 500 and 2000 Angstroms.

14. The method of claim 10, wherein said third poly silicon layer is between about 500 and 2000 Angstroms thick and is doped $N^+$ with an N-type dopant.

15. The method of claim 14, wherein said dopant in said third polysilicon layer is phosphorus (P) and the dopant concentration in said third polysilicon layer is between about 1.0 E 19 and 1.0 E 21 atoms/cm$^3$.

16. The method of claim 10, wherein said isotropic etching of said third insulating layer and said insulating layers of said multilayer is carried out in a hydrofluoric (HF) acid solution.

17. The method of claim 10, wherein said bottom polysilicon layer of said multilayer provides an etch-stop layer for said isotropic etching.

18. The method of claim 17, wherein said bottom polysilicon layer of said multilayer eliminates the need for an additional silicon nitride etch-stop layer.

19. The method of claim 10, wherein said fourth insulating layer is composed of two layers, a layer of low-pressure chemical vapor deposited (LPCVD) silicon oxide formed from the decomposition of tetraetho-siloxane (TEOS) and an upper layer of borophospho-silicate glass (BPSG) formed from a LPCVD silicon oxide doped with boron and phosphorus atoms.

20. The method of claim 10, wherein said bit lines are formed from an $N^+$ doped polysilicon layer and a metal silicide layer.

* * * * *